(12) United States Patent
Iida

(10) Patent No.: US 7,602,018 B2
(45) Date of Patent: Oct. 13, 2009

(54) HIGH WITHSTAND-VOLTAGE SEMICONDUCTOR DEVICE

(75) Inventor: Takeshi Iida, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 152 days.

(21) Appl. No.: 10/836,275

(22) Filed: May 3, 2004

(65) Prior Publication Data

US 2005/0051840 A1    Mar. 10, 2005

(30) Foreign Application Priority Data

May 9, 2003    (JP)    ............................. 2003-131017

(51) Int. Cl.
    *H01L 29/76*    (2006.01)
(52) U.S. Cl. ................... 257/339; 257/342; 257/343; 257/500
(58) Field of Classification Search ......... 257/335–343, 257/491–493, 500–502
    See application file for complete search history.

(56) References Cited

U.S. PATENT DOCUMENTS 4,300,150 A * 11/1981 Colak ......................... 257/336
4,928,155 A * 5/1990 Nakagawa et al. ........... 257/139
5,859,457 A * 1/1999 Thiel et al. ................... 257/335
6,168,983 B1   1/2001 Rumennik et al.
6,207,994 B1 * 3/2001 Rumennik et al. ............ 257/342
6,404,009 B1 * 6/2002 Mori .......................... 257/335
6,593,621 B2 * 7/2003 Tsuchiko et al. .............. 257/335

FOREIGN PATENT DOCUMENTS

JP    10-50992    2/1998
JP    11-163336    6/1999

OTHER PUBLICATIONS

Chinese Office Action dated Jun. 9, 2006 with English translation.

* cited by examiner

*Primary Examiner*—Ori Nadav
(74) *Attorney, Agent, or Firm*—McGinn IP Law Group, PLLC

(57) ABSTRACT

A high withstand-voltage semiconductor device has a gate electrode in a semiconductor layer of one conductivity type, a drain diffusion layer and a source diffusion layer, a thick gate insulating layer between the drain diffusion layer and the gate electrode, and a low-concentration offset diffusion layer of the opposite conductivity type in a region including the drain diffusion layer. A buried layer of the one conductivity type, which has a higher concentration than the semiconductor layer, is provided directly under the gate electrode at approximately the same depth as the depth of the offset diffusion layer. The buried layer disperses field concentration at the drain junction to thereby ensure a higher withstand voltage.

21 Claims, 15 Drawing Sheets

HIGH WITHSTAND-VOLTAGE SEMICONDUCTOR DEVICE

BACKGROUND OF THE INVENTION

1. Field of the Invention

The present invention relates to a semiconductor device including a high withstand-voltage MOS transistor and method of fabricating the same.

2. Description of the Related Art

As a high potential of 10 V, 100 V or so is applied to the output stage of a semiconductor device which drives an LCD (Liquid Crystal Display) or a PDP (Plasma Display Panel), an attempt is made to increase the withstand voltage of an MOS transistor that constitutes the output stage. FIG. 1 shows one example of a conventional high withstand-voltage MOS transistor which is used for such a purpose (Japanese Patent Laid-Open Publication No. H11-163336/1999). An N channel MOS transistor is formed in a device forming region defined by a thick insulating layer (LOCOS layer) 202 formed in a P-type semiconductor substrate 201 of silicon. The MOS transistor has a gate oxide layer 203 and a gate electrode 204 formed at the surface of the semiconductor substrate, and a high-concentration N-type drain diffusion layer 205 and a high-concentration N-type source diffusion layer 206 formed on the respective sides of the gate electrode 204. In the MOS transistor, in order to improve the drain withstand voltage, an LOCOS layer 202a as a thick gate insulating layer is formed at the surface of the substrate in a part of the channel region between the gate electrode 204 and the drain diffusion layer 205, and a low-concentration P-type field relaxing diffusion layer 207 is formed in a region including the drain diffusion layer 205 and a part of the channel region. In FIG. 1, "231" denotes an intermediate insulating layer, "232" denotes a contact plug and "233" denotes a first wire layer.

In the high withstand-voltage MOS transistor, the thick gate insulating layer comprised of the LOCOS layer 202 can ensure a longer electric length between the gate electrode 204 and the drain diffusion layer 205 and the field relaxing diffusion layer 207 can restrain the spreading of the depletion layer that is generated when a potential is applied to the drain diffusion layer 205. This makes it possible to relax field concentration at the drain junction or the junction between the field relaxing diffusion layer 207 and the semiconductor substrate 201 and prevents the current leak from occurring due to breakdown of the electric field, thereby improving the drain withstand voltage. Japanese Patent Laid-Open Publication No. H11-163336/1999 also describes a technique of forming a diffusion layer with an intermediate concentration for relaxing the electric field in the field relaxing diffusion layer in order to further improve the withstand voltage.

However, the present inventor has found out that even in such an MOS transistor having the field relaxing diffusion layer 207, when a high potential needed to drive an LCD or PDP is supplied to the drain, field concentration occurs at the surface portion of the semiconductor substrate at the boundary between the field relaxing diffusion layer 207 and the channel region and makes it difficult to achieve the required high withstand voltage. To improve the withstand voltage and achieve the required high withstand voltage in the MOS transistor, for example, the length of the LOCOS layer 202a may be increased to make the electric length between the gate electrode 204 and the drain diffusion layer 205 longer or the field relaxing diffusion layer 207 may be stretched toward the channel region, thereby weakening the electric field at the field relaxing diffusion layer 207. This scheme however increases the sizes of the drain diffusion layer 205 and the channel region, thereby making the size of the MOS transistor larger, which stands in the way of higher integration of semiconductor devices.

A bidirectional MOS transistor has also been proposed which has an field relaxing diffusion layer formed on both the drain diffusion layer and the source diffusion layer and has a thick gate insulating layer also formed not only on the drain diffusion layer but also between the source diffusion layer and the gate electrode. In such a bidirectional MOS transistor, enlarging the field relaxing diffusion layers on both the source and drain sides or making the thick gate insulating layer longer to increase the withstand voltage makes the device size larger.

SUMMARY OF THE INVENTION

Accordingly, it is an object of the present invention to provide a semiconductor device which improves the withstand voltage without increasing the size of an MOS transistor, and a method of fabricating the semiconductor device.

According to one aspect of the present invention, there is provided a high withstand-voltage semiconductor device including an MOS transistor which has a gate electrode formed on a semiconductor layer of one conductivity type, and a source diffusion layer and a drain diffusion layer of the opposite conductivity type at the surface of the semiconductor layer and where that portion of a gate insulating layer which lies between the drain diffusion layer and the gate electrode is formed thicker than the other portion and a low-concentration offset diffusion layer of the opposite conductivity type is formed in a region including the drain diffusion layer. In the semiconductor device, a buried layer of the one conductivity type, which has a higher concentration than the semiconductor layer, is formed directly under the gate electrode in the semiconductor layer at a depth shallower than a depth of the offset diffusion layer. In the MOS transistor where that portion of the gate insulating layer which is located between the source diffusion layer and the gate electrode is formed thicker than the other portion and an offset diffusion layer is formed in a region including the source diffusion layer, the buried layer is formed in a region sandwiched between both offset diffusion layers.

It is preferable that the buried layer be formed at nearly the same depth as the depth of the offset diffusion layer. It is also preferable that the portion of the gate insulating layer which is thicker than the other portion has a local oxide layer (LOCOS layer) obtained by locally oxidizing a surface of the semiconductor layer or an insulating layer (STI layer) formed by burying an insulator in a groove formed in the surface of the semiconductor layer. It is preferable that the high withstand-voltage semiconductor device should further comprise a guard diffusion layer of the one conductivity type for insulative isolation of the MOS transistor from an adjoining device, and a buried layer of the one conductivity type which is formed in the semiconductor layer between the offset diffusion layer and the guard diffusion layer and has a higher concentration than the semiconductor layer.

According to the semiconductor device of the invention, a buried layer is formed directly under the channel region of the MOS transistor, which has a thick gate insulating layer present between at least the drain diffusion layer and the gate electrode and has a low-concentration offset diffusion layer present in a region including the drain diffusion layer, at a depth shallower than the depth of the offset diffusion layer. The buried layer influences the concentration profile of an impurity in the offset diffusion layer so that the concentration profile is deformed on the channel region side. Particularly, a part of the buried layer overlaps the offset diffusion layer planarly, making the deformation of in concentration profile noticeable, which disperses field concentration at the junction area between the offset diffusion layer and the channel region, i.e., the channel-side end of the offset diffusion layer in the depth direction. This relaxes the ion peak to thereby achieve the high withstand voltage of the MOS transistor. In case where an offset diffusion layer is also formed on the source diffusion layer side, a high withstand voltage is likewise achieved by dispersion of field concentration at the channel-side end of the offset diffusion layer. Further, a high withstand voltage can also be achieved by dispersion of field concentration in the guard region at that end of the guard region where the offset diffusion layer is present.

The technique of forming a high-concentration directly under the channel region is described in, for example, Japanese Patent Laid-Open Publication No. H10-50992/1998. This technique suppresses the stretching of a drain depletion layer, thereby restraining the short channel effect, by forming a buried layer directly under the gate electrode of an MOS transistor which has a drain diffusion layer and a drain low-concentration diffusion layer. Because this technique is applied to an MOS transistor in which a thick insulating layer is not present between the drain diffusion layer and the gate electrode, it is difficult to expect the effect of the invention on field concentration dispersion caused by the influence of the drain low-concentration diffusion layer on the concentration profile. Further, the technique forms the buried layer using a mask for formation of the gate electrode and forms the drain low-concentration diffusion layer by self-alignment using the gate electrode which is formed later. As a result, the buried layer and the drain low-concentration diffusion layer are formed not to overlap each other planarly, making the influence of the impurity of the buried layer on the concentration profile the drain low-concentration diffusion layer small. This makes it hard to expect an effect of relaxing field concentration at the channel-side end of the drain low-concentration diffusion layer.

According to another aspect of the present invention, there is provided a method of fabricating a semiconductor device including an MOS transistor having a gate electrode, a source diffusion layer and a drain diffusion layer. The fabrication method comprises the steps of selectively forming a device isolation insulating layer and a thick gate insulating layer in a region for defining a device forming region in a surface of a semiconductor layer of one conductivity type and a drain-diffusion-layer side region in a channel region, respectively; forming a low-concentration offset diffusion layer by injecting an impurity of an opposite conductivity type in a region including a region where the drain diffusion layer in the device forming region and extending to a part of a region directly under the gate electrode; selectively injecting an impurity for threshold adjustment in a region directly under the gate electrode using a mask; forming a high-concentration buried layer by injecting an impurity of the one conductivity type in the semiconductor layer directly under the gate electrode at a depth shallower than a depth of the offset diffusion layer by using the mask; forming a gate oxide layer and the gate electrode at the surface of the semiconductor layer; and forming the source diffusion layer and the drain diffusion layer by selectively injecting an impurity of the opposite conductivity type in the semiconductor layer using the gate electrode.

In the fabrication method of the invention, the thick gate insulating layer may be formed in the source-side region of the channel region, and an offset diffusion layer may also be formed in a region which includes the source diffusion layer and extends to a part of the region directly under the gate electrode. It is preferable that at the step of forming the buried layer, the buried layer should be so formed as to partly overlap the offset diffusion layer. It is further preferable that the buried layer be formed by ion injection with such energy as to be positioned at approximately the same depth as the depth of the offset diffusion layer.

As the fabrication method of the invention can form a buried layer using a mask used for an ion injection process for threshold adjustment of an MOS transistor which has been used conventionally, the high withstand-voltage semiconductor device of the invention can easily fabricated without increasing the number of processes so much.

DETAILED DESCRIPTION OF THE PREFERRED EMBODIMENTS

Figure 2:
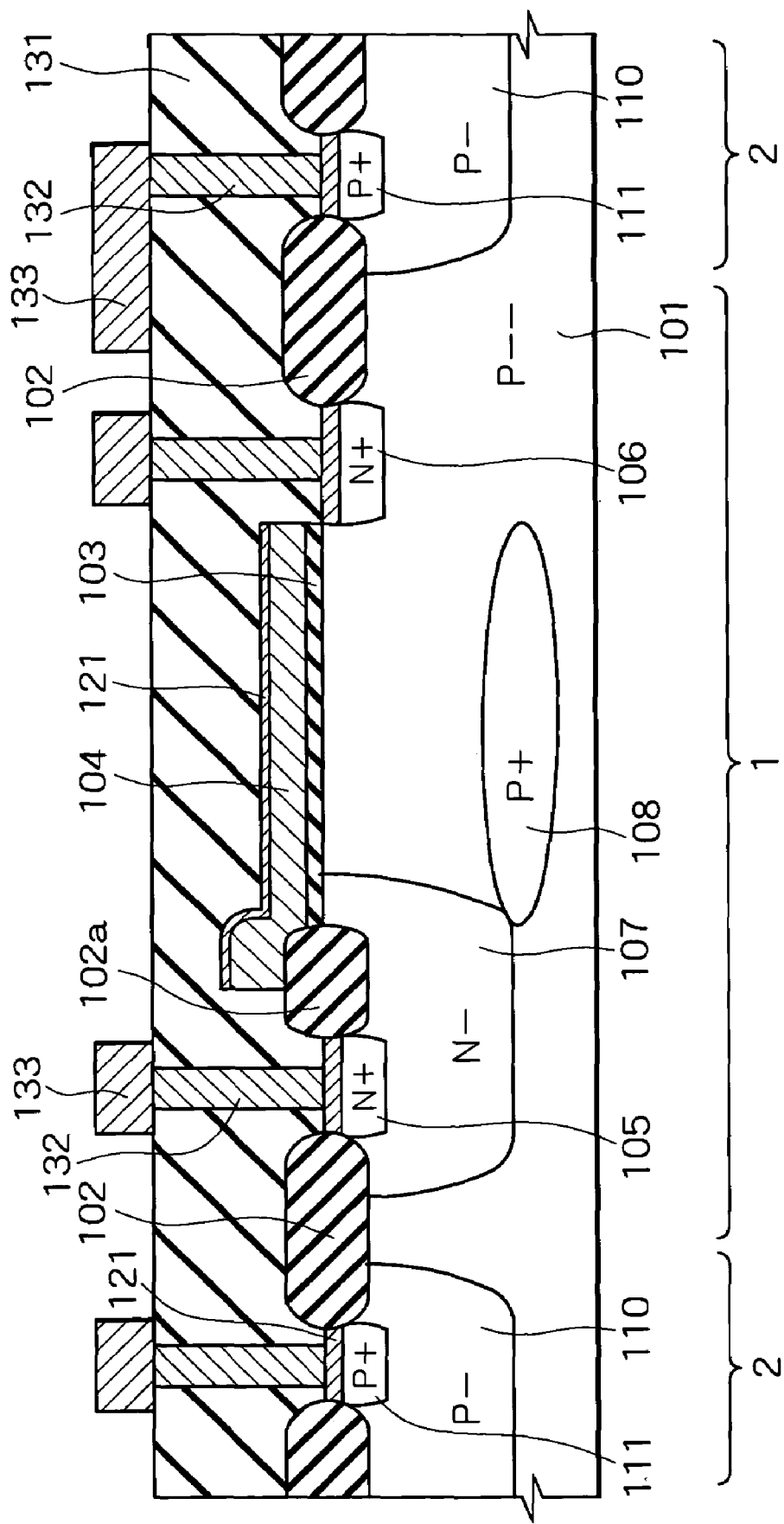
FIG. 2 is a cross-sectional view of a semiconductor device according to a first embodiment of the invention.

Preferred embodiments of the present invention are described below with reference to the accompanying drawings. FIG. 2 is a cross-sectional view of the first embodiment of the invention. A P-type semiconductor substrate 101 is a silicon substrate having an impurity concentration of $1 \times 10^{15}$ cm$^{-3}$ or so. An N channel MOS transistor is formed at the semiconductor substrate 101. The MOS transistor has a device forming region 1 defined by an LOGOS layer 102 which is selectively formed at the surface of the P-type semiconductor substrate 101 and is electrically isolated from another device by a guard region 2 formed outside the LOGOS layer 102. A gate oxide layer 103 is formed at the surface of the device forming region 1 of the semiconductor substrate 101 and a gate electrode 104 of phosphorus-contained polysilicon is formed on the gate oxide layer 103. N-type diffusion layers having a high concentration of about $1 \times 10^{18}$ to $1 \times 10^{20}$ cm$^{-3}$ are formed at the semiconductor substrate 101 on both sides of the gate electrode 104, respectively. One of the N-type diffusion layers serves as a drain diffusion layer 105 and the other serves as a source diffusion layer 106. An LOGOS layer 102a is formed at the boundary between the drain diffusion layer 105 and the gate electrode 104 as a gate insulating layer thicker than the other portion. An N-type diffusion layer (called "offset diffusion layer" hereinafter) 107 with an impurity concentration of about $1 \times 10^{16}$ to $1 \times 10^{17}$ cm$^{-3}$, higher than the impurity concentration of the semiconductor substrate 101 and lower than the impurity concentration of the drain diffusion layer 105, is formed in a region which includes the LOGOS layer 102a and the drain diffusion layer 105 and extends to a part of a region directly under the gate electrode 104.

A P-type buried layer 108 with an impurity concentration of about $1 \times 10^{17}$ to $1 \times 10^{18}$ cm$^{-3}$, higher than the impurity concentration of the semiconductor substrate 101 and higher than the impurity concentration of the offset diffusion layer 107, is formed in a region directly under the gate electrode 104 at approximately the same depth as the depth of the offset diffusion layer 107. The P-type buried layer 108 is formed nearly over the entire region directly under the gate electrode 104, so that a part of the drain-side region of the P-type buried layer 108 is so formed as to overlap the offset diffusion layer 107 in the direction of the thickness of the semiconductor substrate 101, i.e., three-dimensionally.

A guard diffusion layer 110 having an impurity concentration of about $1 \times 10^{16}$ to $1 \times 10^{17}$ cm$^{-3}$ is formed in the guard region 2 and a guard contact diffusion layer 111 is formed at the surface of the guard diffusion layer 110. A metal silicide layer 121 of a high-melting point metal is formed at the surface of each of the drain diffusion layer 105, the source diffusion layer 106 and the guard contact diffusion layer 111. An interlayer insulating layer 131 is formed on the semiconductor substrate 101 and a conductive material is buried in a contact hole formed in the interlayer insulating layer 131 to form a contact plug 132. The contact plug 132 electrically connects the drain diffusion layer 105, the source diffusion layer 106 and the guard contact diffusion layer 111 to a first wire layer 133 on the interlayer insulating layer 131, so that a given potential is supplied to the layers 105, 106 and 111.

Figure 3:
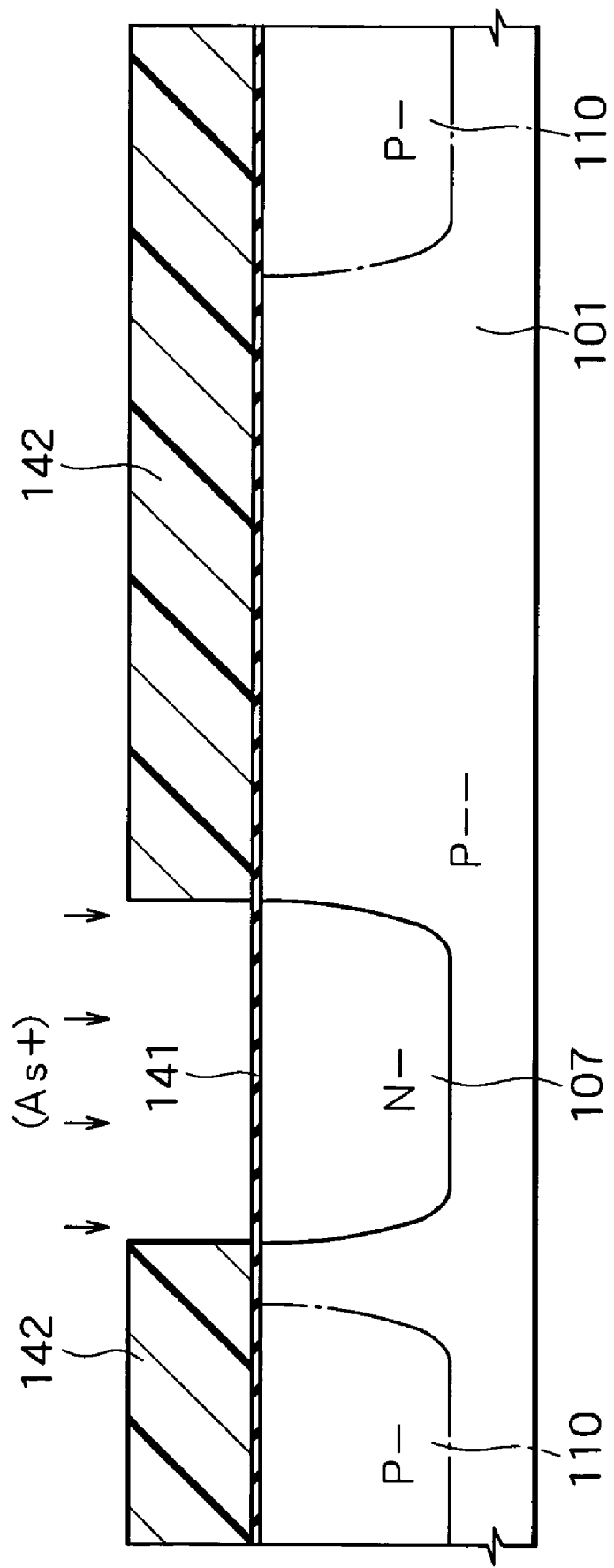
FIG. 3 is a cross-sectional view of a first step illustrating a fabrication method according to the first embodiment.

FIGS. 3 to 8 are process-by-process cross-sectional views illustrating a fabrication method for the semiconductor device according to the first embodiment. First, after a pad thermal oxide layer 141 is formed at the surface of the semiconductor substrate 101, using a photoresist layer 142 formed on the pad thermal oxide layer 141 as a mask, phosphorus is ion-injected in that drain-side region of the device forming region for the formation of an MOS transistor which includes a part of the channel region, with energy of about 500 KeV and a dose of the $1 \times 10^{12}$ cm$^{-2}$ order, thereby forming an N-type diffusion layer (offset diffusion layer) 107 with an impurity concentration of about $1 \times 10^{16}$ to $1 \times 10^{17}$ cm$^{-3}$, as shown in FIG. 3. As indicated by chain lines in FIG. 3, boron is ion-injected into the guard region likewise using the photoresist layer to thereby form a P-type diffusion layer (guard diffusion layer) 110 with an impurity concentration of about $1 \times 10^{16}$ to $1 \times 10^{17}$ cm$^{-3}$.

Figure 4:
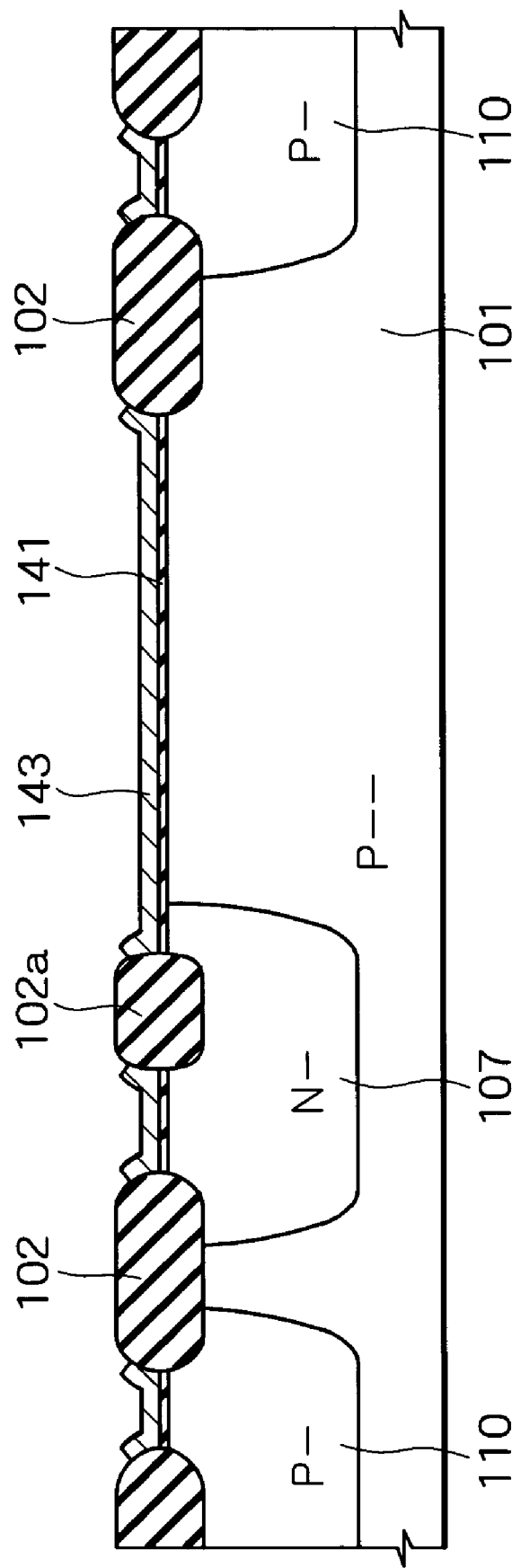
FIG. 4 is a cross-sectional view of a second step illustrating the fabrication method according to the first embodiment.

Next, as shown in FIG. 4, after the photoresist layer is removed, a silicon nitride layer 143 is formed on the pad thermal oxide layer 141 and the silicon nitride layer 143 in an LOCOS forming region is etched off with an unillustrated photoresist used as a mask. Then, with the silicon nitride layer 143 as an anti-oxide layer, the surface of the semiconductor substrate 101 is selectively oxidized to form the LOCOS layer 102 as a device isolation insulating layer. The LOCOS layer 102 defines the device forming region 1 of the MOS transistor and the region outside the device forming region 1 is constructed as the guard region 2 that isolates the MOS transistor from other devices around it. A part 102a of the LOCOS layer is formed, as a thick gate oxide layer, at a position which lies at the boundary between the channel region and the drain diffusion layer of the MOS transistor to be formed.

Figure 5:
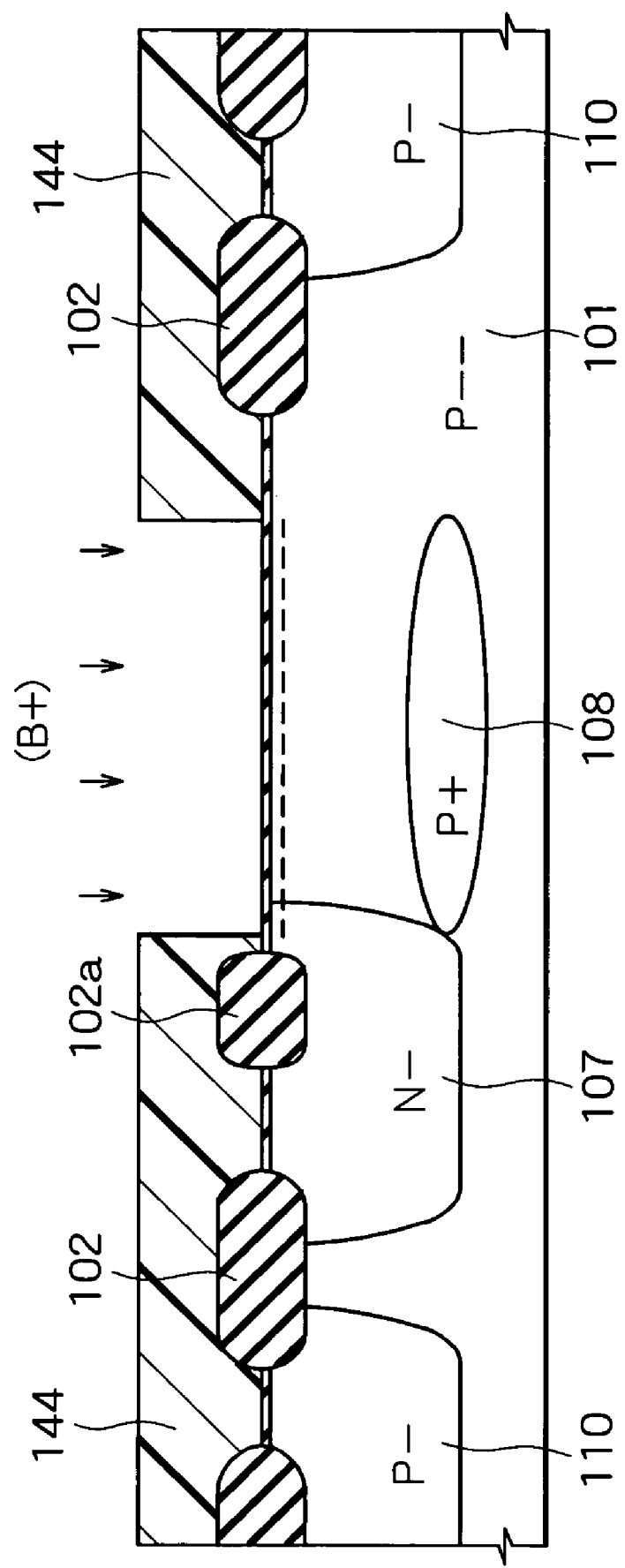
FIG. 5 is a cross-sectional view of a third step illustrating the fabrication method according to the first embodiment.

Next, as shown in FIG. 5, boron for gate threshold adjustment is ion-injected in the channel region of the MOS transistor with low energy of about 150 keV to the desired concentration, using a photoresist layer 144 selectively formed so as to open a channel region at the surface of the semiconductor substrate 101. With the same photoresist layer 144 used as a mask, boron is ion-injected into the same region with high energy of about 500 keV and a dose of $1 \times 10^{12}$ cm$^{-2}$, thereby forming the P-type buried layer 108. The P-type buried layer 108 is formed at approximately the same depth as the depth of the offset diffusion layer 107 with a concentration of about $1 \times 10^{17}$ to $1 \times 10^{18}$ cm$^{-3}$. As a part of the offset diffusion layer 107 extends to the channel region, a part of the drain-side region of the P-type buried layer 108 is so formed as to overlap the offset diffusion layer 107 in the direction of the thickness of the semiconductor substrate 101 or three-dimensionally.

Figure 6:
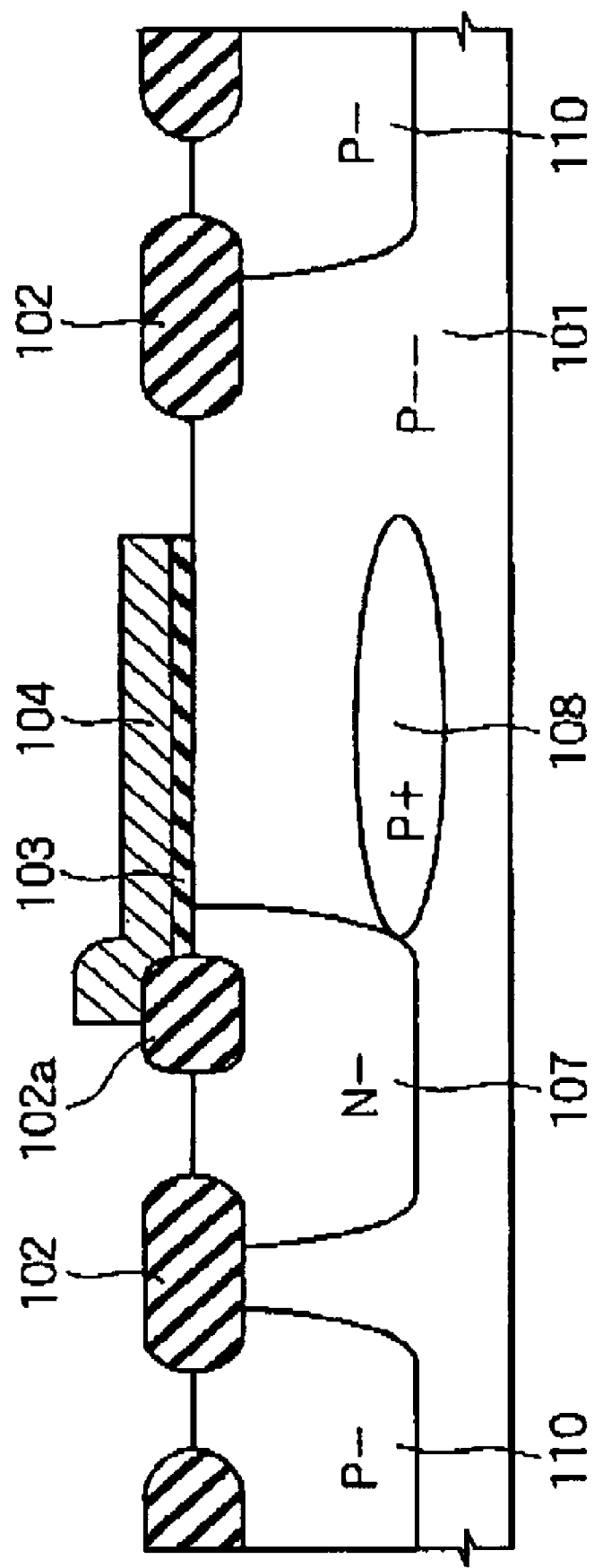
FIG. 6 is a cross-sectional view of a fourth step illustrating the fabrication method according to the first embodiment.

Next, the pad thermal oxide layer 141 at the surface is removed and a thin thermal oxide layer is newly grown to form the gate oxide layer 103, as shown in FIG. 6. A phosphorus-doped polysilicon layer is formed on the gate oxide layer 103, and is then patterned to form the gate electrode 104.

Figure 7:
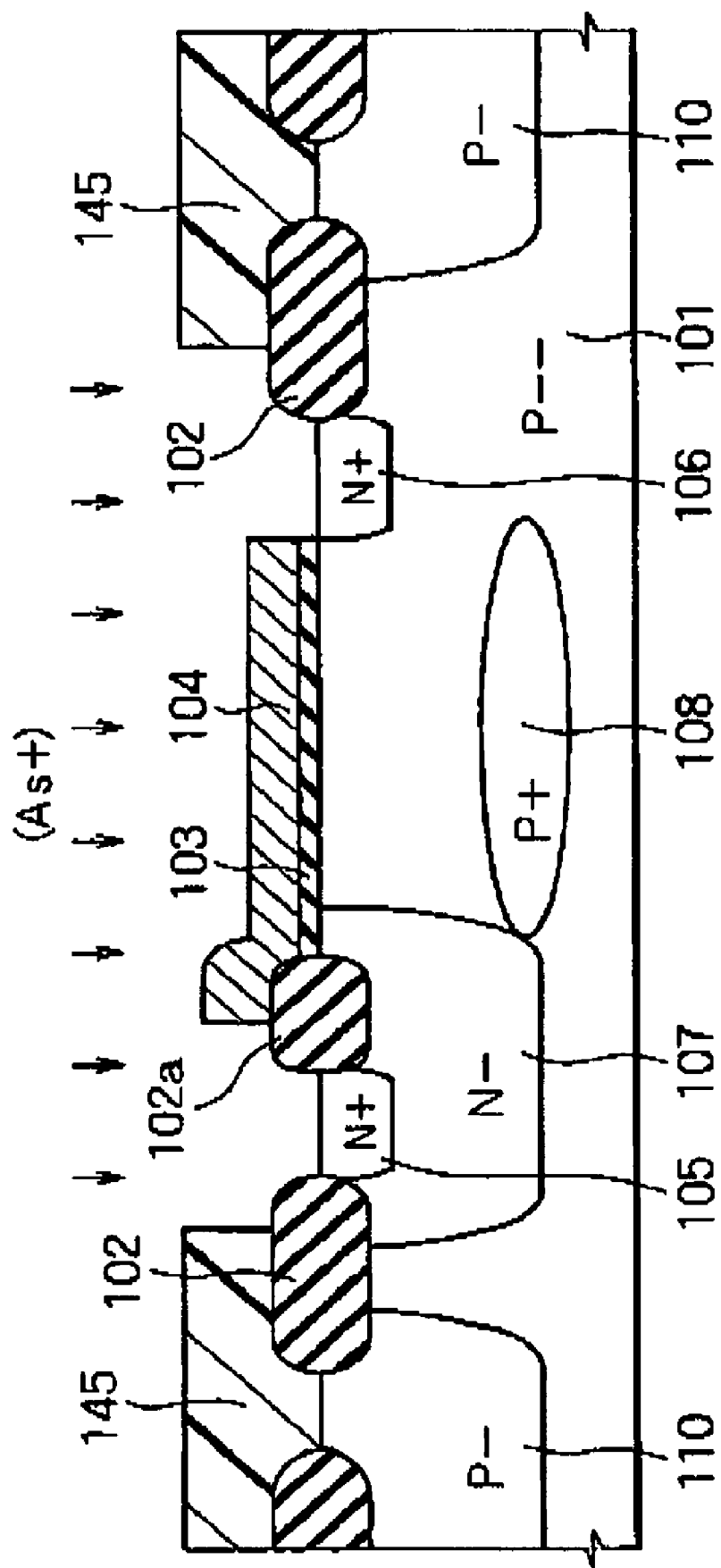
FIG. 7 is a cross-sectional view of a fifth step illustrating the fabrication method according to the first embodiment.

Next, as shown in FIG. 7, arsenic is ion-injected in the device forming region in a self-alignment manner with a dose of about $1 \times 10^{15}$ cm$^{-2}$ using a photoresist layer 145 selectively formed at the surface of the semiconductor substrate 101 and the gate electrode 104, thereby forming the N-type gate electrode 104 and the source diffusion layer 106 with impurity concentrations of about $1 \times 10^{18}$ to $1 \times 10^{20}$ cm$^{-3}$.

Figure 8:
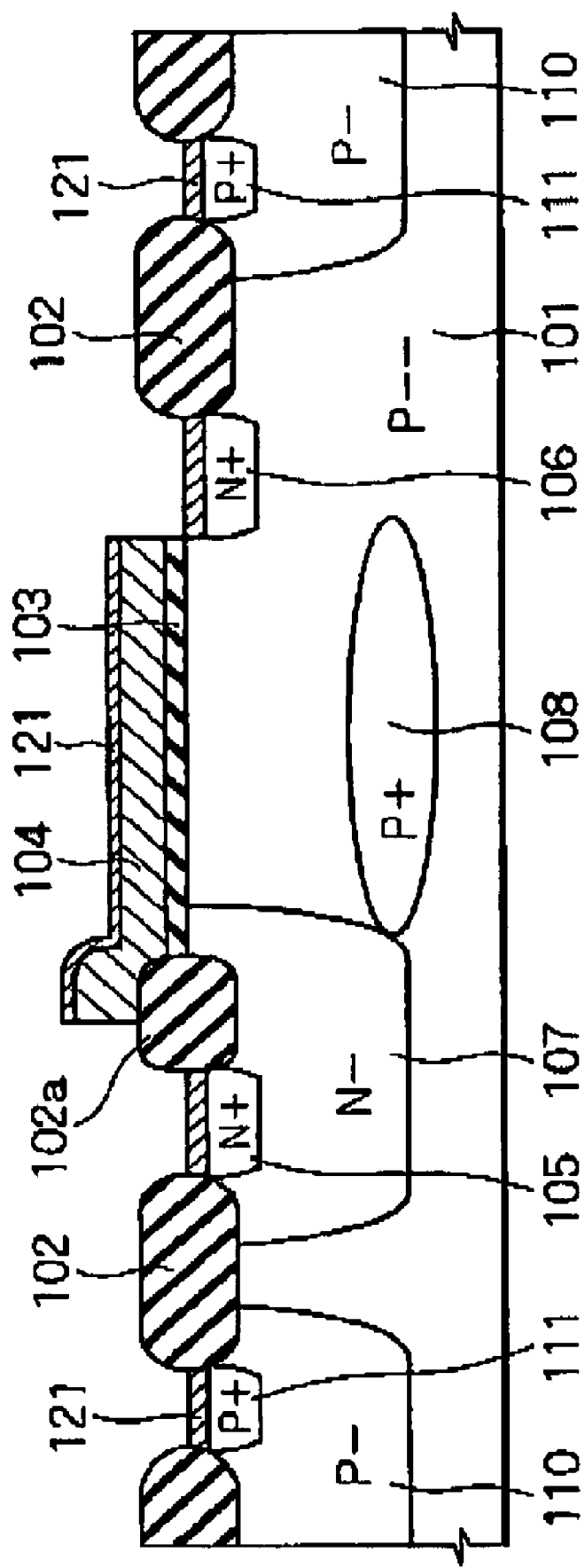
FIG. 8 is a cross-sectional view of a sixth step illustrating the fabrication method according to the first embodiment.

Then, as shown in FIG. 8, boron is ion-injected in the guard diffusion layer 110 with a dose of about $1 \times 10^{15}$ cm$^{-2}$ using an unillustrated photoresist layer, thereby forming the P-type guard contact diffusion layer 111 with an impurity concentration of about $1 \times 10^{18}$ to $1 \times 10^{20}$ cm$^{-3}$.

Next, a high-melting point metal layer of titanium or so is formed on the entire surface and is subjected to a heat treatment, thus forming the metal silicide layer 121 on the top surface of the gate electrode 104 and the surfaces of the drain diffusion layer 105, the source diffusion layer 106 and the guard contact diffusion layer 111. Then, as shown in FIG. 2, the interlayer insulating layer 131 of silicon oxide is formed on the entire surface, a contact hole is bored in the drain diffusion layer 105, the source diffusion layer 106 and the guard contact diffusion layer 111, and a metal such as copper is buried in the contact hole to from the contact plug 132, though not described in detail for the process is not so pertinent to the invention. Further, the first wire layer 133 of copper or so which connects to the contact plug 132 is formed on the interlayer insulating layer 131.

Figure 1:
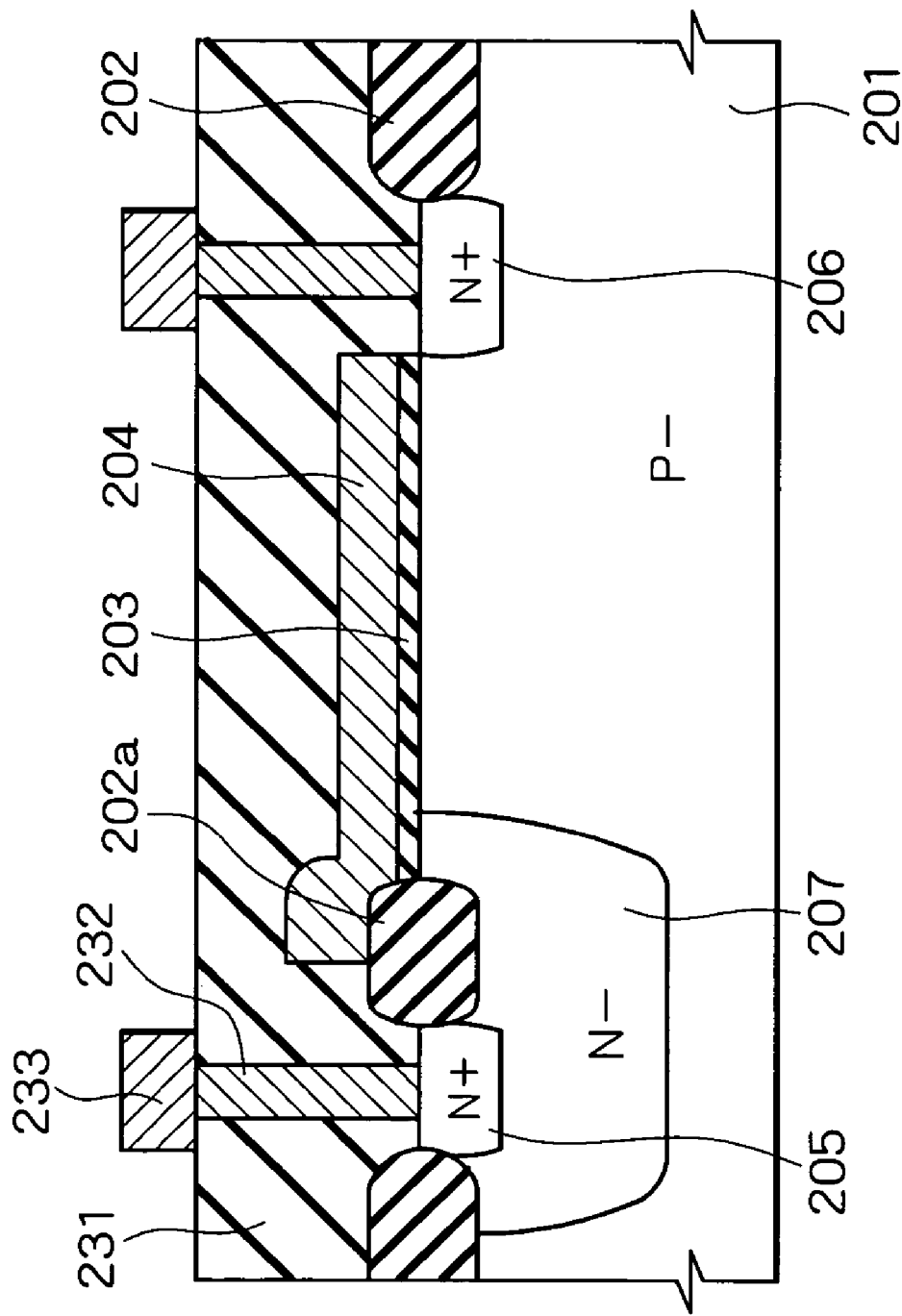
FIG. 1 is a cross-sectional view showing one example of a conventional high withstand-voltage semiconductor device.

According to the MOS transistor with the structure, the LOCOS layer 102a as a thick gate insulating layer present between the gate electrode 104 and the drain diffusion layer 105 makes the electric length therebetween longer and the depletion layer of the drain diffusion layer 105 is suppressed by the low-concentration offset diffusion layer 107 covering the drain diffusion layer 105 in the channel region, relaxing field concentration at the channel-side end of the offset diffusion layer 107 and ensuring an improvement of the drain withstand voltage as per the conventional MOS transistor illustrated in FIG. 1. In addition, as the P-type buried layer 108 of the opposite conductivity type to the conductivity type of the offset diffusion layer 107 is present in the region directly under the gate electrode 104 at approximately the same depth as the depth of the offset diffusion layer 107 in the MOS transistor of the embodiment, the P-type buried layer 108 influences the concentration profile in such a way that the junction between the offset diffusion layer 107 and the semiconductor substrate 101 is set back toward the drain diffusion layer 105. Because the P-type buried layer 108 is so formed as to overlap the offset diffusion layer 107 in the embodiment, particularly, the influence on the concentration profile becomes prominent. Accordingly, the concentration profile of the offset diffusion layer 107 is deformed in such a way as to be set back toward the drain in the channel-side region and is particularly set back toward a region under the LOCOS layer 102a in a depth-wise part of the channel-side region.

Figure 9A:
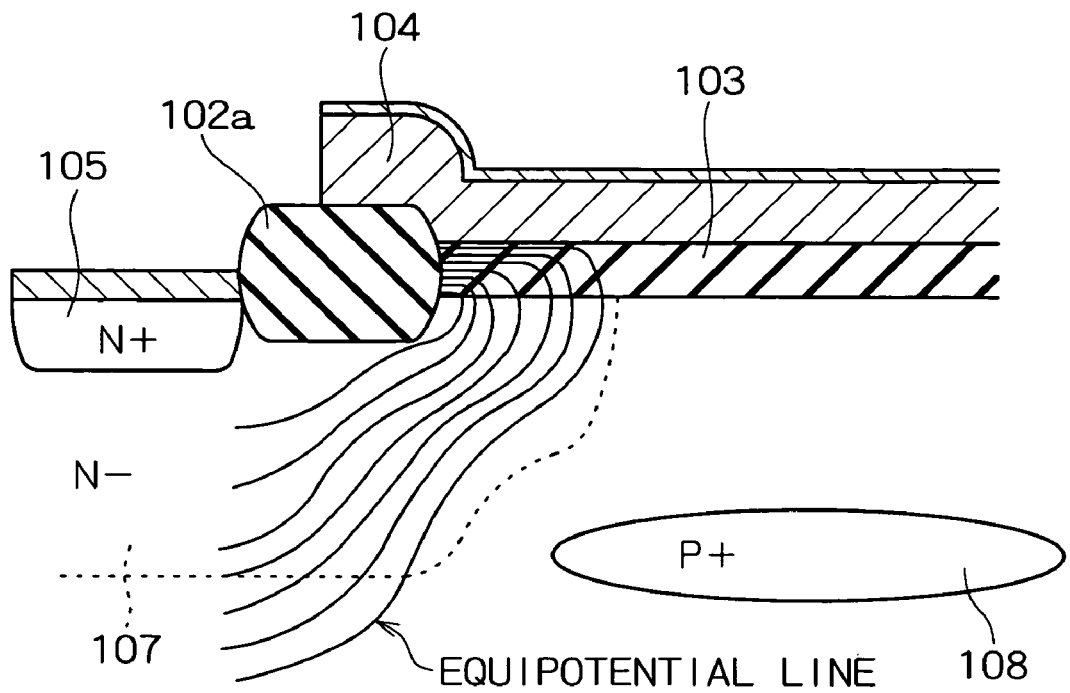
FIGS. 9A and 9B are simulation diagrams illustrating the field concentration dispersing effect of a P-type buried layer.
Figure 9B:
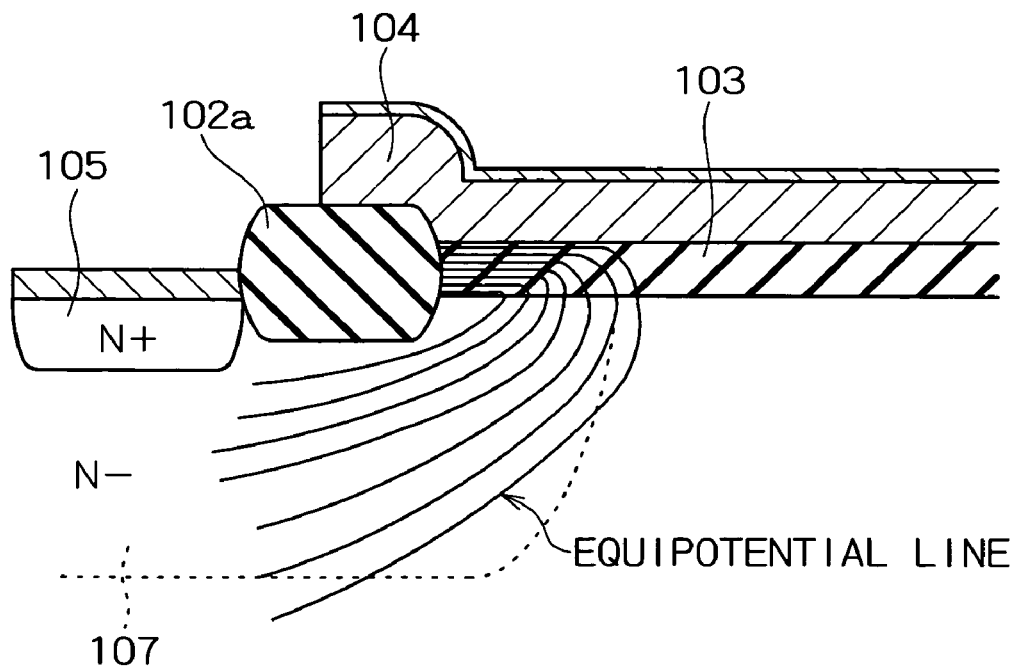

FIG. 9A shows an equipotential line chart, for example, when a signal of a given positive potential is applied to the gate electrode 104 of the MOS transistor, a potential of 35 V is applied to the drain diffusion layer 105 and a potential of 0 V is applied to the source diffusion layer 106 and the semiconductor substrate 101, i.e., when a high potential is applied to the drain diffusion layer 105. FIG. 9B is an equipotential line chart when the P-type buried layer 108 is not formed. Apparently, the formation of the P-type buried layer 108 influences the concentration profile of the impurity in the offset diffusion layer 107 so that the equipotential lines ripple and are set back toward the drain and the intervals between the equipotential lines become wider. As a result, the field density in the offset diffusion layer 107, i.e., the field intensity, is relaxed, thereby dispersing the field distribution, concentrated on the drain-side end of the channel region, in the depth direction toward a wide region under the LOCOS layer 102a from that end. This relaxes field concentration and suppresses the field-oriented junction breakdown, thereby improving the drain withstand voltage. When the P-type buried layer 108 is absent, as in FIG. 9B, it is apparent that the equipotential lines are present only in the offset diffusion layer 107 so that the intervals between the equipotential lines in the offset diffusion layer 107 become narrower, causing field concentration. When the P-type buried layer 108 is absent, therefore, the concentration points of the generation of impact ions which would cause field breakdown are concentrated on the drain-side end of the channel region and the number of occurred peaks is $3.3 \times 10^{26}$/sec·μm, whereas the formation of the P-type buried layer 108 as in FIG. 9A disperses the concentration points of the generation of impact ions between the portion under the LOCOS layer and the channel region, reducing the number of occurred peaks to $6.1 \times 10^{25}$/sec·μm.

Figure 10A:
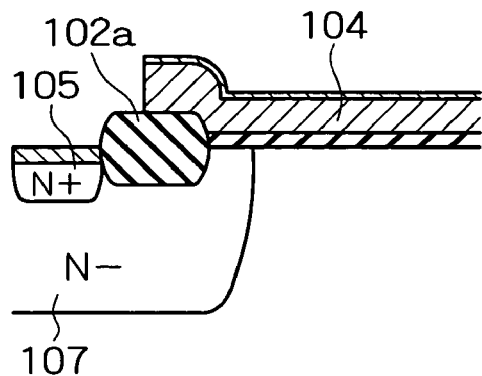
FIGS. 10A to 10F are simulation diagrams illustrating the field concentration dispersing effects for different energies of injection into a P-type buried layer.
Figure 10B:
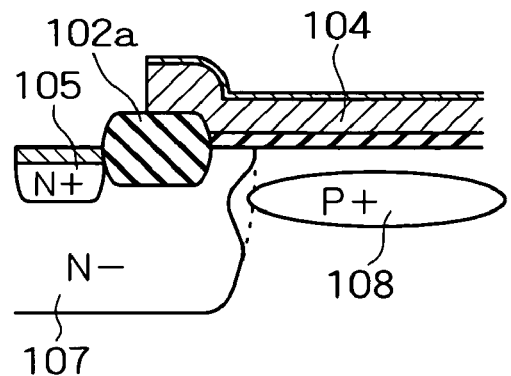
Figure 10C:
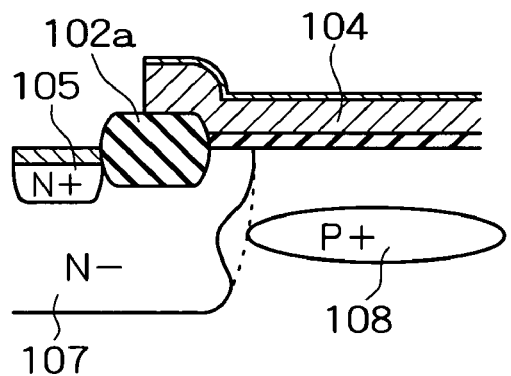
Figure 10D:
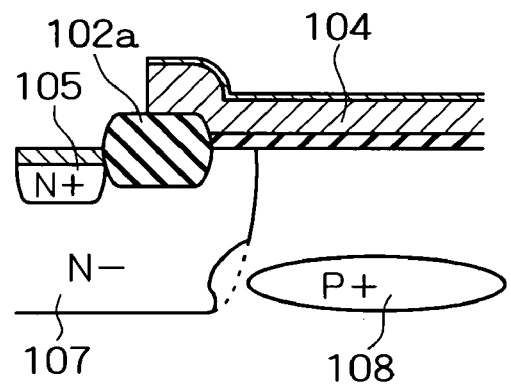
Figure 10E:
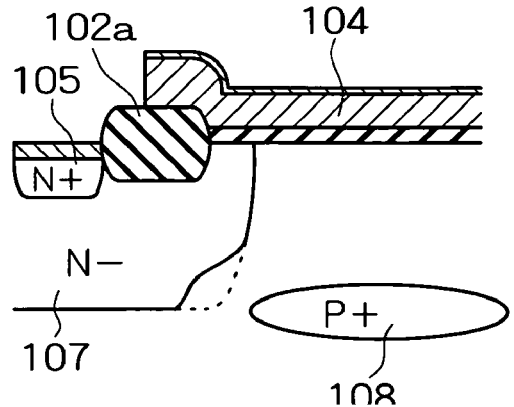
Figure 10F:
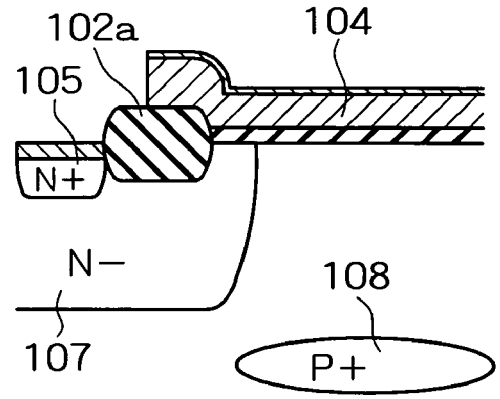
Figure 11:
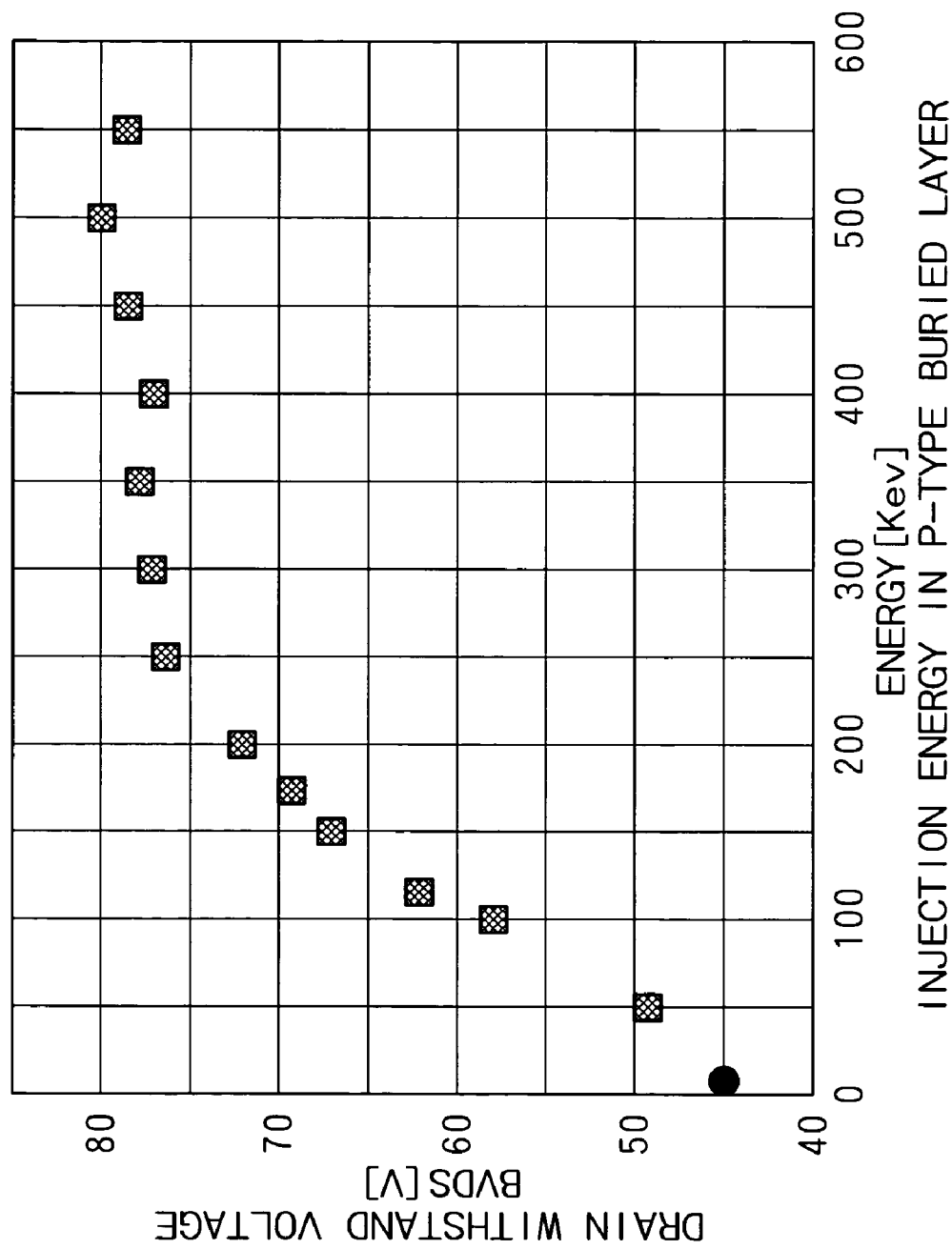
FIG. 11 is a simulation diagram illustrating the drain withstand voltage which varies depending on a difference in energy of injection into a P-type buried layer.

FIGS. 10A to 10F present simulation diagrams of the junction interface in the offset diffusion layer 107 when MOS transistors are designed in such a way that their depths are made different from one another. FIG. 10A is a simulation diagram when the P-type buried layer 108 is absent, while FIGS. 10B to 10F are simulation diagrams when the P-type buried layer 108 is formed with injection energies of 100 keV, 300 keV, 400 keV, 500 keV and 900 keV, respectively, with boron injected with a dose of $3 \times 10^{12}$ cm$^{-2}$. The greater the injection energy becomes, the deeper the P-type buried layer 108 is formed. In this example, energy of 300 keV makes the depth of the P-type buried layer 108 approximately the same as the depth of the offset diffusion layer 107 (which is the depth at the intermediate position in the direction of the depth of the offset diffusion layer 107 in the present specification), and energy greater that level forms the P-type buried layer 108 at a deeper position. FIG. 11 is a diagram illustrating the drain withstand voltage of the MOS transistor when the injection energy is changed in a range from 50 keV to 600 keV. As the injection energy is set greater than 250 keV or greater than 300 keV in view of a slight margin taken, the influence of the P-type buried layer 108 on the impurity concentration profile of the offset diffusion layer 107 becomes noticeable, thus improving the drain withstand voltage, as has been described referring to FIGS. 9A and 9B. When the injection energy is lower than 300 keV, the P-type buried layer 108 acts to push the channel region of the offset diffusion layer 107 upward and does not act to set back the channel region toward the region under the LOCOS layer 102a. This level, 300 keV, is the energy that forms the P-type buried layer 108 at approximately the same depth as the depth of the offset diffusion layer 107 as mentioned above, so that even with the slight margin taken into consideration, setting the injection energy equal to or higher than 300 keV can provide a sufficient withstand voltage. Even if the injection energy is set greater than the mentioned level to form the P-type buried layer 108 at a deeper position, the preferable influence on the offset diffusion layer 107 does not become greater and the withstand voltage is apparently saturated.

Figure 12:
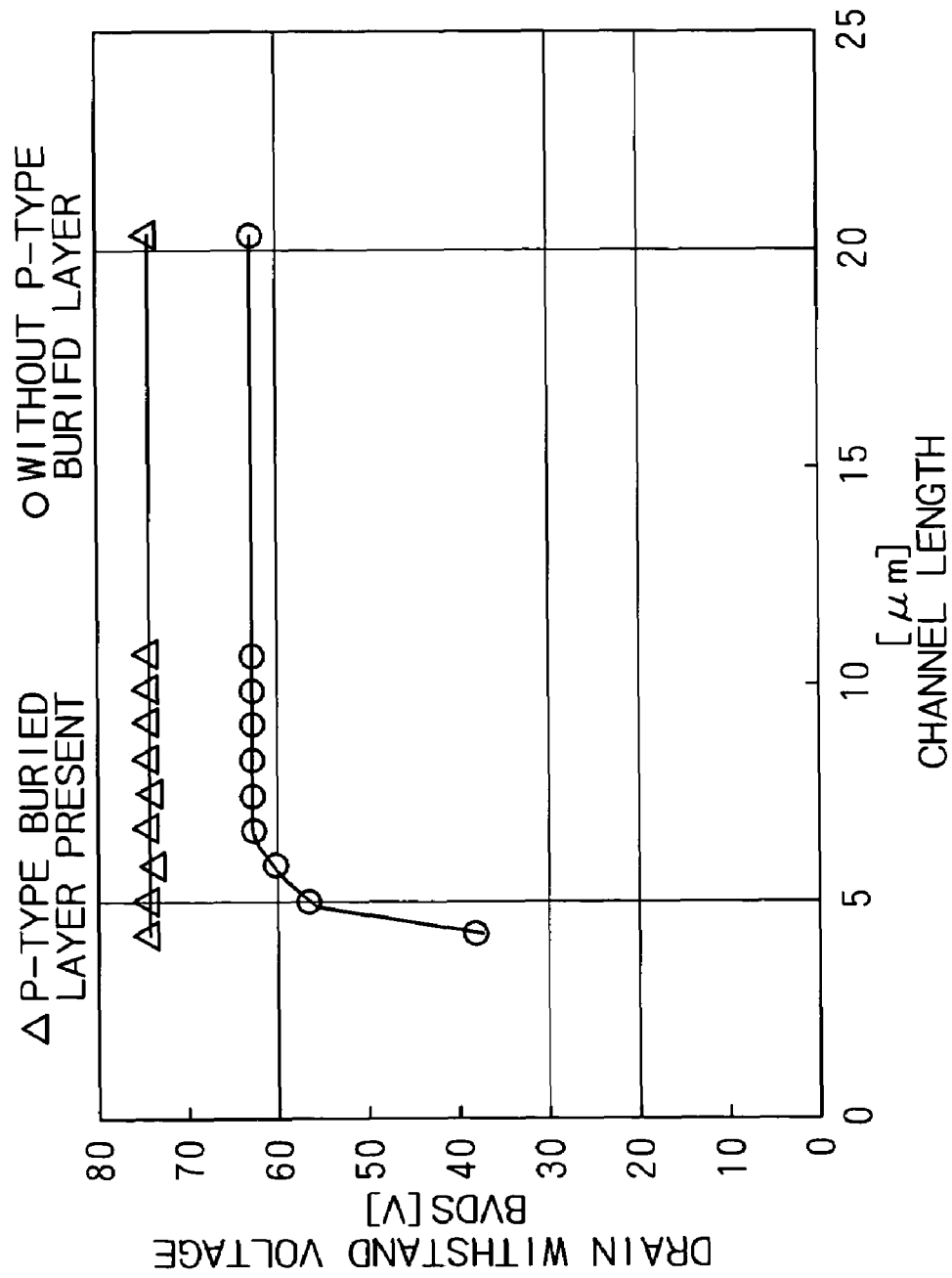
FIG. 12 is a simulation diagram illustrating the drain withstand voltage that depends on the channel length.

In the MOS transistor of the embodiment, therefore, in case where the device is down-sized by reducing the length (channel length) of the gate electrode 104 and the size of the drain diffusion layer 105, the field dispersing effect of the P-type buried layer 108 can provide a sufficient drain withstand voltage even when a required high potential is applied to an LCD or PDP or so which is driven by the MOS transistor. This can ensure high integration of semiconductor devices. FIG. 12 is a diagram illustrating the gate-length dependency of the drain withstand voltage in cases where the P-type buried layer 108 is present and it is absent. It is apparent from the diagram that the presence of the P-type buried layer 108 can keep a sufficient drain withstand voltage even when the gate length is made shorter.

Figure 13:
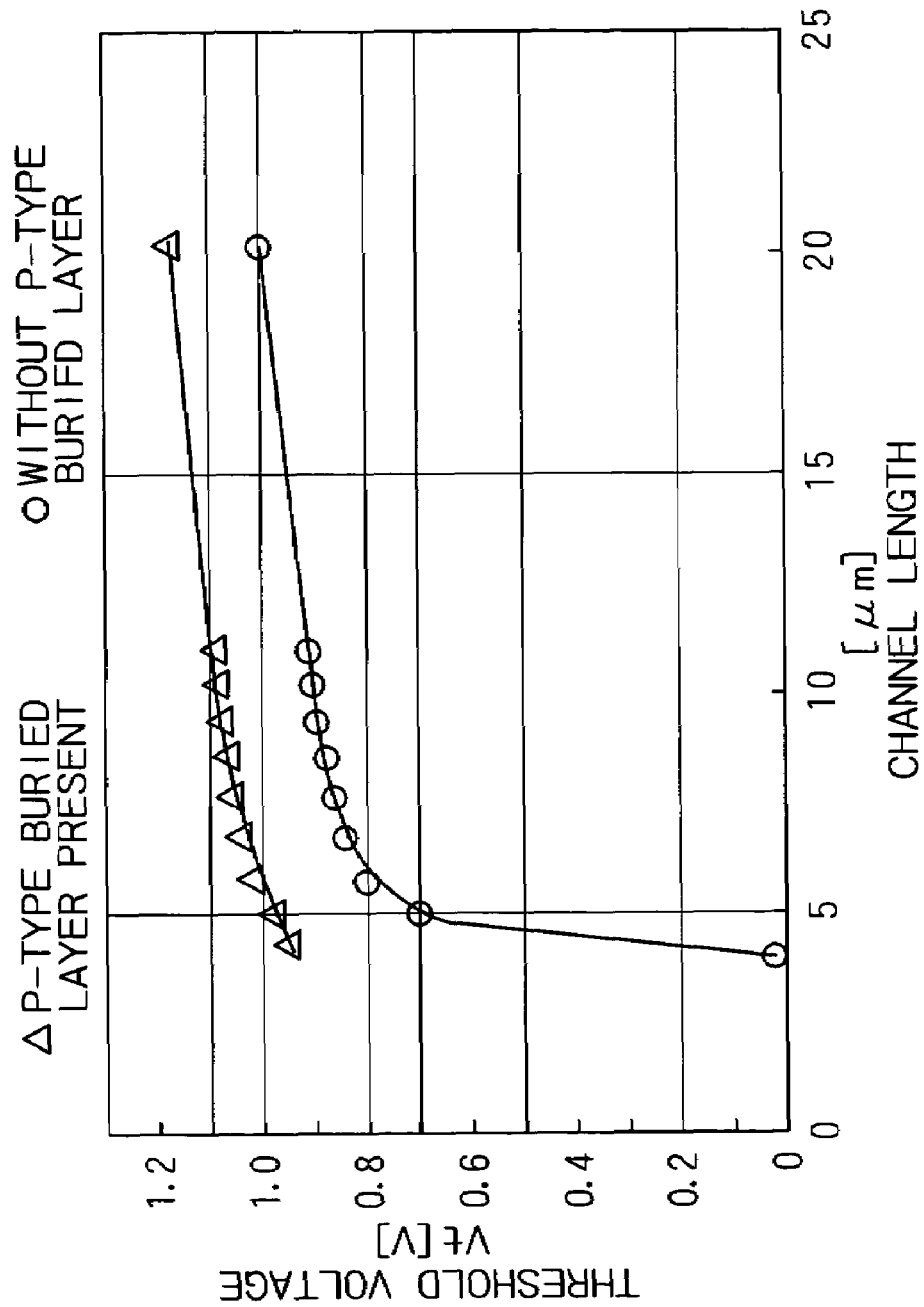
FIG. 13 is a simulation diagram illustrating the threshold voltage that depends on the channel length.

Even when the channel length is shortened by designing the MOS transistor smaller, the presence of the high-concentration P-type buried layer 108 directly under the gate electrode 104 can restrain the depletion layer to be formed in the channel region from extending to the source side and can improve the short channel effect. FIG. 13 is a diagram illustrating the gate-length dependency of the threshold voltage in cases where the P-type buried layer 108 is present and it is absent. It is apparent that the presence of the P-type buried layer 108 can suppress a reduction in threshold voltage and can improve the short channel effect.

Figure 14:
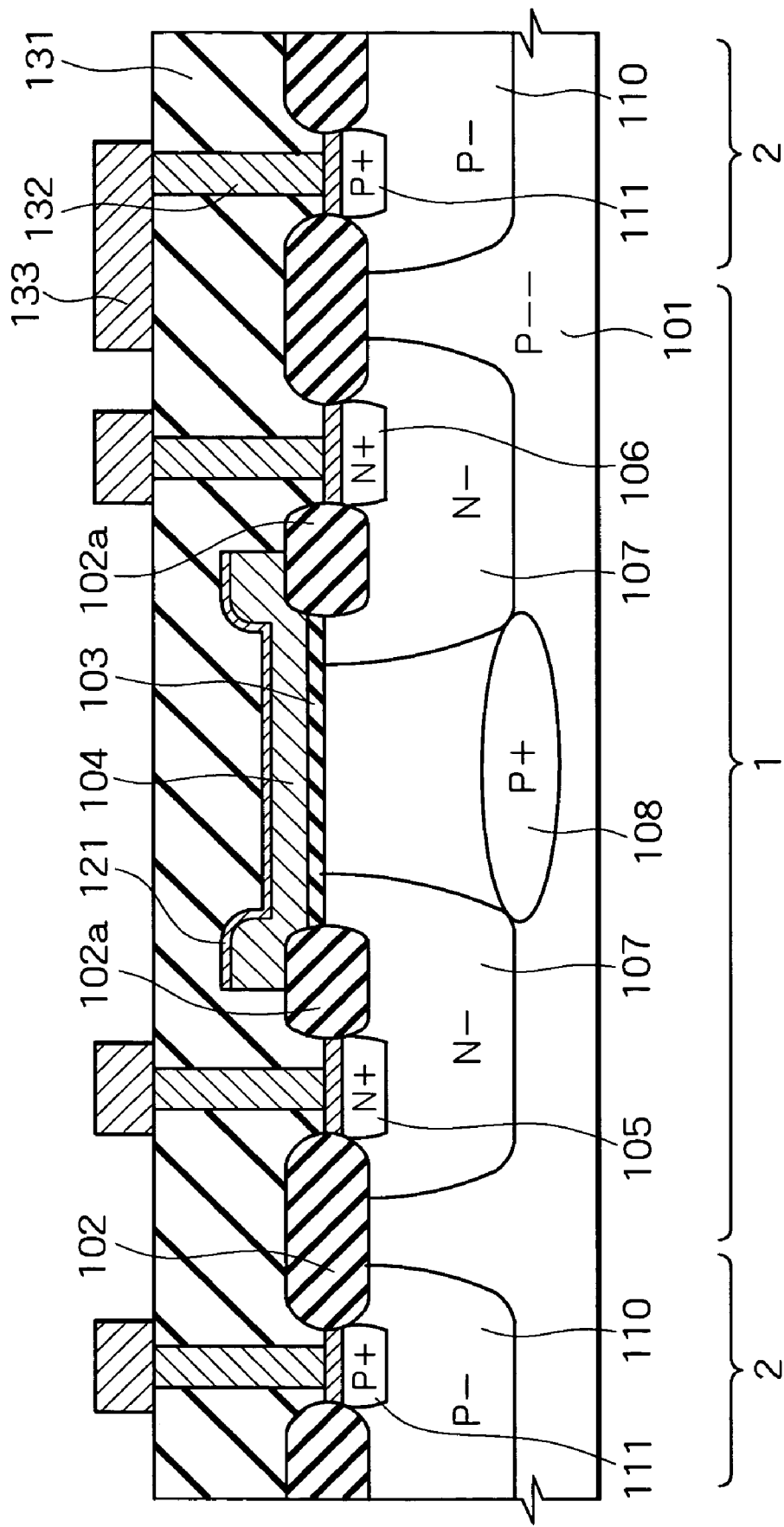
FIG. 14 is a cross-sectional view of a semiconductor device according to a second embodiment of the invention.

FIG. 14 is a cross-sectional view of a semiconductor device according to a second embodiment of the invention which is given same reference numerals as those of equivalent portions of the first embodiment. With regard to the individual diffusion layers to be discussed later, the impurity concentrations are set equal to those explained in the foregoing description of the first embodiment. An N channel MOS transistor is formed at the P-type semiconductor substrate 101. The MOS transistor has the device forming region 1 defined by the LOCOS layer 102 which is formed at the surface of the P-type semiconductor substrate 101 and is electrically isolated from another device by the guard region 2 formed outside the LOCOS layer 102. Further, a pair of LOCOS layers 102a are formed as thick gate oxide layers at the surface of the device forming region 1 of the semiconductor substrate 101, a channel region is defined inside the LOCOS layers 102a and drain and source regions are defined outside both LOCOS layers 102a. In the channel region, the gate oxide layer 103 is formed at the surface of the semiconductor substrate 101 and the gate electrode 104 is formed on the gate oxide layer 103. High-concentration N-type diffusion layers are formed in the drain and source regions, one serving as the drain diffusion layer 105 while the other serves as the source diffusion layer 106. Further, the N-type offset diffusion layers 107 having a higher concentration than the semiconductor substrate 101 and the N-type offset diffusion layer 107 having a lower concentration than the drain diffusion layer 105 and the source diffusion layer 106 are respectively formed in regions which respectively include the drain diffusion layer 105 and the source diffusion layer 106 and extend to a part of the channel region.

The high-concentration P-type buried layer 108 is formed in the semiconductor substrate 101 directly under the gate electrode 104 between both offset diffusion layers 107 including the drain and source diffusion layers, at approximately the same depth as the depth of the offset diffusion layers 107, as per the first embodiment. In this example, the P-type buried layer 108 is formed at a position where a part of the P-type buried layer 108 planarly overlaps both offset diffusion layers 107 on the drain and source sides.

The guard region 2 formed outside the MOS transistor is formed outside the LOCOS layer 102 and the guard diffusion layer 110 comprised of a diffusion layer having one conductivity type is formed in the guard region 2 and the high-concentration guard contact diffusion layer 111 is formed at the surface of the guard diffusion layer 110. Further, the metal silicide layer 121 is formed at the surface of each of the gate electrode 104, the drain diffusion layer 105, the source diffusion layer 106 and the guard contact diffusion layer 111 and is electrically connected to the first wire layer 133 via the contact plug 132 provided on the interlayer insulating layer 131 as per the first embodiment.

In the second embodiment, the LOCOS layer 102a as a thick gate insulating layer is formed between the gate electrode 104 and each of the drain diffusion layer 105 and the source diffusion layer 106 and the offset diffusion layer 107 is formed in each of the diffusion layers 105 and 106. Therefore, the drain and source have a symmetrical structure and the drain withstand voltage or the source withstand voltage is improved for the same reason as given in the first embodiment without specifying the directivity of the drain and the source. In addition, the P-type buried layer 108 provided in the invention can disperse the electric field at the channel-side end of the drain diffusion layer 105 or the source diffusion layer 106 to prevent field concentration, thereby further improving the withstand voltage.

Figure 15:
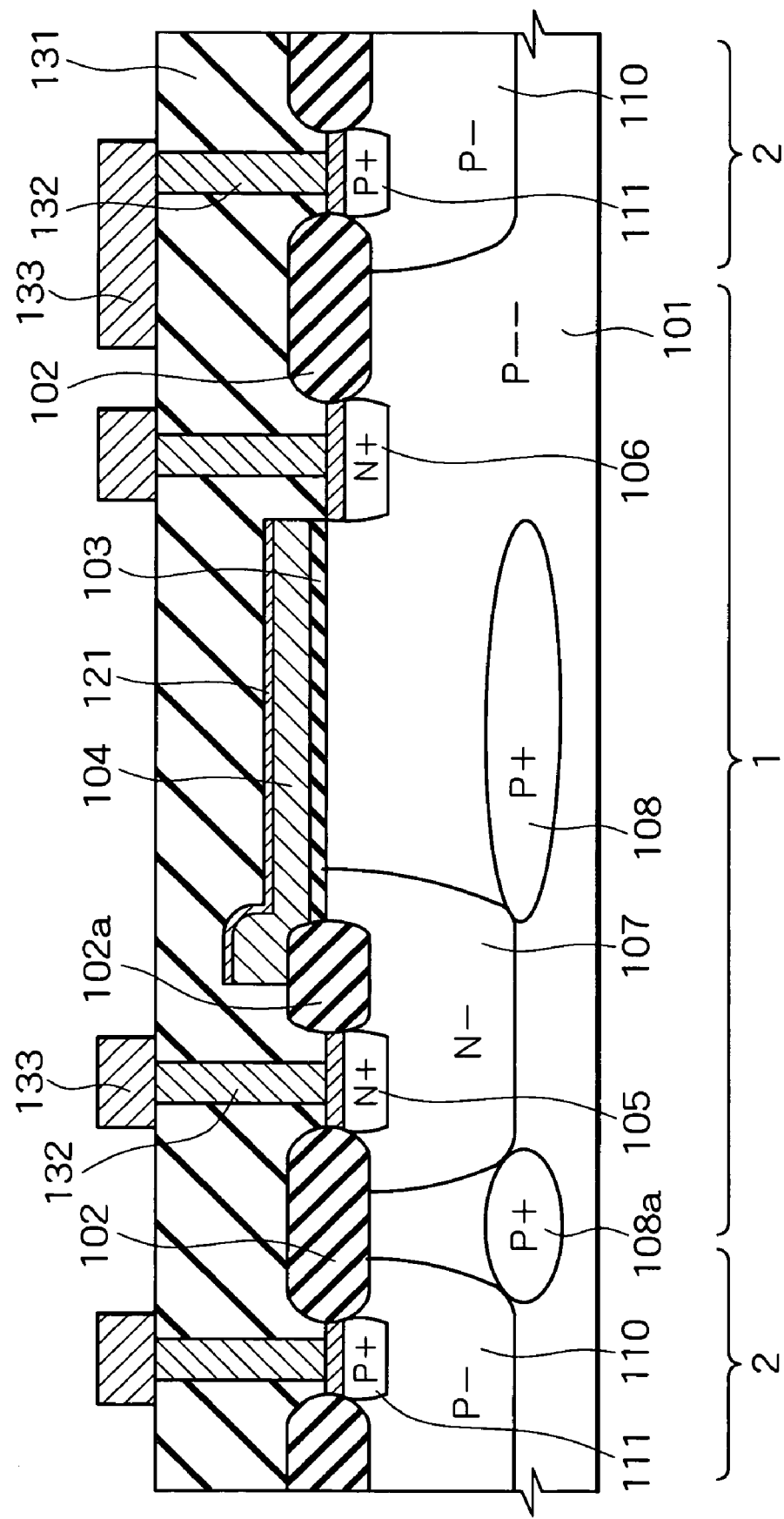
FIG. 15 is a cross-sectional view of a modification of the first embodiment.

In the invention, a buried layer similar to the P-type buried layer in each of the embodiments may be formed in the guard region too. For example, FIG. 15 shows a P-type buried layer 108a formed in the guard region 2 in the first embodiment. While the guard diffusion layer 110 with an impurity concentration of about $1 \times 10^{16}$ to $1 \times 10^{17}$ cm$^{-3}$ is formed in the guard region 2, the offset diffusion layer 107 is present in the region of the MOS transistor adjacent to the guard diffusion layer 110 as mentioned above, and, like the P-type buried layer 108 directly under the gate electrode, the P-type buried layer 108a with an impurity concentration of about $1 \times 10^{17}$ to $1 \times 10^{18}$ cm$^{-3}$ is formed in the region sandwiched between the guard diffusion layer 110 and the offset diffusion layer 107. The P-type buried layer 108a in the guard region 2 is formed by ion injection or the like before the formation of the LOCOS layer 102 to define the device forming region.

With the structure, when a high potential is applied to the drain, an electric field which is generated between the offset diffusion layer 107 and the guard contact diffusion layer 111, i.e., between the offset diffusion layer 107 the guard diffusion layer 110, in the guard region 2 can be dispersed in the region below the LOCOS layer 102 from the surface portion of the offset diffusion layer 107 by the P-type buried layer 108a. This can suppress field breakdown originated from field concentration and improve the withstand voltage in the guard region 2. The formation of the P-type buried layer 108a in the guard region can likewise be applied to the semiconductor device of the second embodiment shown in FIG. 11. In this case, it is needless to say that the effect of improving the withstand voltage can be enhanced by forming a part of the P-type buried layer 108a so as to planarly overlap the offset diffusion layer 107.

Although the device isolation insulating layer and the thick gate insulating layer are formed by LOCOS in each embodiment, they may be formed by STI by which a shallow trench is formed in the surface of the semiconductor substrate and an insulator such as a silicon oxide layer is buried in the trench.

Although the foregoing description has been given of the case where an N channel MOS transistor is formed in a P-type semiconductor substrate, the same is true of the case where a P channel MOS transistor is fabricated in which case the offset diffusion layer of each of the drain and source is comprised of a P-type diffusion layer, so that the buried layer is formed as an N-type buried layer. Of course, the semiconductor layer that forms an MOS transistor may be a semiconductor layer epitaxially grown on the semiconductor substrate or an impurity-doped semiconductor well.

According to the invention, as described above, a high-concentration buried layer of one conductivity type is formed directly under the channel region of an MOS transistor whose conductivity type is opposite to the one conductivity type of the semiconductor layer at a depth is equal to or shallower than the depths of the offset diffusion layers of the drain diffusion layer and the source diffusion layer, so that the buried layer influences the concentration profile of the impurity in the offset diffusion layer, thereby dispersing field concentration at the drain-side end of the channel region. This relaxes the ion peak and can thus ensure a high withstand voltage for the MOS transistor. Even in case where an offset diffusion layer is formed in the source diffusion layer, a high withstand voltage is likewise achieved by dispersing field concentration at the source-side end of the channel region. Particularly, the effect of increasing the withstand voltage can be further enhanced by forming the buried layer in such a way as to partly overlap the offset diffusion layer 107. Further, the formation of a buried layer also in the guard region can disperse field concentration at that end of the guard region which lies on the offset diffusion layer side, thus ensuring a high withstand voltage.

What is claimed is:

1. A high withstand-voltage semiconductor device including an MOS transistor, comprising:

a semiconductor layer of one conductivity type;

a gate electrode of said MOS transistor which is formed on said semiconductor layer;

a source diffusion layer and a drain diffusion layer of an opposite conductivity type to that of said semiconductor layer which are formed at a surface of said semiconductor layer;

a gate insulating layer of said MOS transistor having a portion between said drain diffusion layer and said gate electrode which has a thickness greater than a thickness of another portion of said gate insulating layer;

an offset diffusion layer of said opposite conductivity type which is in direct contact with said drain diffusion layer other than a top surface of said drain diffusion layer and which includes a low impurity concentration; and a buried layer of said one conductivity type including a portion that lies directly under the gate electrode being longer than another portion of the buried layer that does not lie directly under the gate electrode, the buried layer formed in said semiconductor layer at a depth substantially equal to a depth of said offset diffusion layer and includes a greater impurity concentration than that of said semiconductor layer.

2. The high withstand-voltage semiconductor device according to claim 1, wherein a lower portion of said buried layer is formed at a depth greater than the depth of said offset diffusion layer.

3. The high withstand-voltage semiconductor device according to claim 1, wherein said buried layer is formed so as to partly overlap said offset diffusion layer.

4. The high withstand-voltage semiconductor device according to claim 1, wherein a thick portion of said gate insulating layer includes a local oxide layer.

5. The high withstand-voltage semiconductor device according to claim 1, further comprising a guard diffusion layer of said one conductivity type that isolates by insulating said MOS transistor from an adjoining device, and a second buried layer of said one conductivity type which is formed in said semiconductor layer between said offset diffusion layer and said guard diffusion layer and includes a greater impurity concentration than that of said semiconductor layer.

6. The high withstand-voltage semiconductor device according to claim 1, further comprising:

a second offset diffusion layer of said opposite conductivity type formed in a region including said drain diffusion layer and includes a low impurity concentration.

7. The high withstand-voltage semiconductor device according to claim 6, wherein said buried layer of said one conductivity type formed between said offset diffusion layer and said second offset diffusion layer.

8. The high withstand-voltage semiconductor device according to claim 1, wherein said buried layer of said one conductivity type partially overlaps said offset diffusion layer of said opposite conductivity type in a planar vertical direction.

9. The high withstand-voltage semiconductor device according to claim 7, wherein said buried layer of said one conductivity type partially overlaps said offset diffusion layer and said second offset diffusion layer of said opposite conductivity type.

10. The high withstand-voltage semiconductor device according to claim 5, wherein said second buried layer of said one conductivity type partially overlaps said offset diffusion layer of said opposite conductivity type.

11. The high withstand-voltage semiconductor device according to claim 5, wherein said second buried layer of said one conductivity type partially overlaps said guard diffusion layer of said one conductivity type.

12. A high withstand-voltage semiconductor device including an MOS transistor, comprising:

a semiconductor layer of one conductivity type;

a gate electrode of said MOS transistor farmed on said semiconductor layer;

a source diffusion layer and a drain diffusion layer of an opposite conductivity type to that of said semiconductor layer which are formed at a surface of said semiconductor layer;

a portion of a gate insulating layer of said MOS transistor having a portion between said drain diffusion layer and said gate electrode which has a thickness greater than a thickness of another portion of said gate insulating layer;

an offset diffusion layer of said opposite conductivity type in direct contact with said drain diffusion layer other than a top surface of said drain diffusion layer and which includes a low impurity concentration; and a buried layer of said one conductivity type including a portion that lies directly under the gate electrode being longer than another portion of the buried layer that does not lie directly under the gate electrode, the buried layer being formed in said semiconductor layer.

13. The high withstand-voltage semiconductor device according to claim 12, wherein said buried layer of said one conductivity type is formed at a depth nearly equal to a depth of said offset diffusion layer.

14. The high withstand-voltage semiconductor device according to claim 12, wherein a lower portion of said buried layer is formed at a depth deeper than a depth of said offset diffusion layer.

15. The high withstand-voltage semiconductor device according to claim 12, wherein said buried layer of said one conductivity type is formed including a greater impurity concentration than that of said semiconductor layer.

16. The high withstand-voltage semiconductor device according to claim 12, a second offset diffusion layer of said opposite conductivity type which is formed in a region including said drain diffusion layer and includes a low impurity concentration.

17. The high withstand-voltage semiconductor device according to claim 16, wherein said buried layer of said one conductivity type is formed between said offset diffusion layer and said second offset diffusion layer.

18. The high withstand-voltage semiconductor device according to claim 17, wherein said buried layer of said one conductivity type partially overlaps said offset diffusion layer and said second offset diffusion layer of said opposite conductivity type.

19. A high withstand-voltage semiconductor device including an MOS transistor, comprising:

a semiconductor layer of one conductivity type;

a gate electrode of said MOS transistor formed on said semiconductor layer;

a source diffusion layer and a drain diffusion layer of an opposite conductivity type to that of said semiconductor layer which are formed at a surface of said semiconductor layer;

a gate insulating layer of said MOS transistor which has a thickness greater than a thickness of another portion of said gate insulating layer, said gate insulating layer formed between said drain diffusion layer and said gate electrode;

a first offset diffusion layer of said opposite conductivity type formed in a region including said drain diffusion layer and includes a low impurity concentration;

a second offset diffusion layer of said opposite conductivity type which is in direct contact with said source diffusion layer other than a top surface of said drain diffusion layer and which includes a low impurity concentration; and a buried layer of said one conductivity type including a portion that lies directly under the gate electrode being longer than another portion of the buried layer that does not lie directly under the gate electrode, the buried layer being formed in said semiconductor layer at a depth substantially equal to a depth of said first and second offset diffusion layers and includes a greater impurity concentration than that of said semiconductor layer.

20. The high withstand-voltage semiconductor device according to claim 19, wherein said buried layer of said one conductivity type partially overlaps said first offset diffusion layer of said opposite conductivity type.

21. The high withstand-voltage semiconductor device according to claim 19, wherein said buried layer of said one conductivity type partially overlaps said second offset diffusion layer of said opposite conductivity type.

* * * * *